(12) United States Patent
Bentley

(10) Patent No.: US 7,859,646 B2
(45) Date of Patent: Dec. 28, 2010

(54) INTERFEROMETRIC METHOD FOR IMPROVING THE RESOLUTION OF A LITHOGRAPHIC SYSTEM

(75) Inventor: Sean J. Bentley, Farmingville, NY (US)

(73) Assignee: Adelphi University, Garden City, NY (US)

( * ) Notice: Subject to any disclaimer, the term of this patent is extended or adjusted under 35 U.S.C. 154(b) by 698 days.

(21) Appl. No.: 11/763,725

(22) Filed: Jun. 15, 2007

(65) Prior Publication Data

US 2008/0174847 A1 Jul. 24, 2008

Related U.S. Application Data

(60) Provisional application No. 60/886,436, filed on Jan. 24, 2007.

(51) Int. Cl.
 *G03B 27/54* (2006.01)
(52) U.S. Cl. .......................... 355/67; 359/577
(58) Field of Classification Search ............ 355/67, 355/53; 356/450; 359/577, 583
 See application file for complete search history.

(56) References Cited

U.S. PATENT DOCUMENTS

| 7,536,012 B1 * | 5/2009 | Meyers et al. ............... 380/44 |
| 2006/0170896 A1 * | 8/2006 | Markoya et al. ............. 355/67 |

OTHER PUBLICATIONS

S. J. Bentley and R. W. Boyd, "Nonlinear optical lithography for ultra-high sub-Rayleigh solution," Optics Express 12, 5735 (2004).

Boyd, Robert W. et al., Recent progress in quantum and nonlinear optical lithography, Journal of Modern Optics, vol. 53, Nos. 5-6, pp. 713-718, Mar. 2005.

Yablonovitch, Eli et al., Optical projection lithography at half the Rayleigh resolution limit by two-photon exposure, Opt. Eng. 38(2), pp. 334-338, Feb. 1999.

Kok, Pieter et al., Quantum-interferometric optical lithography: Towards arbitrary two-dimensional patterns, Physical Review A, vol. 63, pp. 063407 1-8 (2000).

Nagasako, Elna M. et al., Parametric downconversion vs optical parametric amplification: a comparison of their quantum statistics, Journal of Modern Optics, vol. 49, No. 3/4, pp. 529-537, 2002.

Gerry, Christopher C., Enhanced generation of twin single-photon states via quantum interference in parametric down-conversion: Application to tw0-photon quantum photolithography, Physical Review A 67, 2003.

(Continued)

*Primary Examiner*—Peter B Kim
*Assistant Examiner*—Chia-how Michael Liu
(74) *Attorney, Agent, or Firm*—Leason Ellis LLP

(57) ABSTRACT

According to one exemplary embodiment of the present invention, a method for writing an arbitrary, two-dimensional pattern using interferometric lithography and classical techniques includes the steps of: (1) creating a pixel array defined by a number of pixels having specific coordinates; (2) mapping pixel information based on the desired pattern, the pixel information including a list of which pixels are activated to define the desired two-dimensional pattern; (3) controlling a relative strength of each pixel for indicating a feature height of a portion of the desired two-dimensional pattern; and (4) controlling a degree that one pixel is shifted in an x-direction and a y-direction relative to original coordinates of the pixel in order to define the desired two-dimensional pattern pixel by pixel.

6 Claims, 7 Drawing Sheets

OTHER PUBLICATIONS

Nagasako, Elna M. et al., Nonclassical two-photon interferometry and lithography with high-gain parametric amplifiers, Physical Review A, vol. 64, 2001.

Boto, Agedi N. et al., Quantum Interferometric Optical Lithography: Exploiting Entanglement to Beat the Diffraction Limit, Physical Review Letter, vol. 85, No. 13, Sep. 2000.

Bjork, Gunnar et al., Entangled-State Lithography: Tailoring Any Patter with a Single State, Physical Review Letter, vol. 86, No. 20, May 2001.

Agarwal, Girish S. et al., Comment on "Quantum Interferometric Opitcal Lithography: Exploiting Entanglement to Beat the Diffraction Limit," Physical Review Letters, vol. 86, No. 7, Feb. 2001.

D'Angelo, Milena et al., Two-Photon Diffraction and Quantum Lithography, Physical Review Letters, vol. 87, No. 1, Jul. 2001.

Bentley, Sean J., Ultra-Resolution, Arbitrary Pattern Formation Technique for Lithography based on Nonlinear Classical Interferometry, Department of Physics, Adelphi University, Nov. 2006

* cited by examiner

| 1 | 2 | 3 |
|---|---|---|
| 4 | 5 | 6 |
| 7 | 8 | 9 |

MxM subarray
N = 3

Fig. 2 m x m subarray where N=3

INTERFEROMETRIC METHOD FOR IMPROVING THE RESOLUTION OF A LITHOGRAPHIC SYSTEM

CROSS REFERENCE TO RELATED APPLICATION

The present application claims the benefit of U.S. patent application Ser. No. 60/886,436, filed Jan. 24, 2007, which is hereby incorporated by reference.

TECHNICAL FIELD

The present invention relates to lithographic systems and in particular, to a method and system for generating arbitrary, two-dimensional lithographic patterns with a resolution M-times better than allowed by the Rayleigh criterion.

BACKGROUND

The constant push in the integrated circuit industry to generate smaller features for next-generation computer chips has caused great interest in improved lithographic techniques. Traditionally, however, it was believed that for a given wavelength used to write the patterns, there was a limit to the feature size given by the Rayleigh criterion. While for many years the techniques faced more practical limitations than the physical limitation imposed by Rayleigh's criterion, technology has now reached the level to meet this limit. Thus, it is commonly viewed that the primary option to reduce feature sizes further involves going to shorter and shorter wavelengths. As optical lithography has already approached the lower wavelength limits, this would leave the next alternative seemingly to switch to e-beam or x-ray lithography, both of which are extremely costly and have many practical drawbacks at this time. Therefore, there is great interest in developing new techniques to bypass the Rayleigh criterion, allowing the integrated circuit industry to continue to make major advances without the costly need to abandon optical lithography on which it is always depended.

In the past several years, such techniques began to be developed, all relying on materials that absorb multiple photons at a time, rather than one at a time as traditionally used. While some of the earliest proposals were classical, most of the attention has been given to quantum lithography. Although it is interesting due to the special properties that it could provide, there are a number of disadvantages and limitations with quantum lithography, especially with respect to its future use in the circuit industry.

In an article co-authored by the present applicant, namely, S. J. Bentley and R. W. Boyd, "Nonlinear optical lithography for ultra-high sub-Rayleigh solution," Optics Express 12, 5735 (2004), a one-dimensional, classical, nonlinear interferometric lithographic system is described. The primary idea is to interfere two beams on an N-photon absorbing lithographic substrate. This is repeated M times (with M≦N), each time increasing the relative phase between the two beams by $2\pi/M$. This results in canceling the undesired low-resolution features and leaving only features with a resolution M-times better than allowed by the Rayleigh criterion. One initial concern with all of the classical techniques, such as the one described in this article, is the resulting pattern visibility. If one lets M=N to achieve the maximum possible resolution enhancement, the visibility quickly degrades beyond a useful level for increasing N. However, as long as N is significantly larger than M, a high visibility is always possible.

The disclosed technique in this reference is limited to one-dimensional patterns and for practical considerations, the technique is limited to very simple 1-D patterns. Thus, there are a number of disadvantages and practical limitations that prevent this technique from having wide-spread success.

It is therefore, desirable to have a simple yet effective process for writing an arbitrary two-dimensional pattern using nonlinear, interferometric lithography techniques. The embodiments described herein satisfy these and other needs.

SUMMARY

According to one aspect of the present invention, a method for writing an arbitrary, two-dimensional pattern on a recording material using interferometric lithography and classical techniques includes the steps of: generating first and second light beams that carry horizontal (x) information; generating third and fourth light beams that carry vertical (y) information; interfering the first and second beams in a horizontal manner on the recording material and interfering the third and fourth beams in a vertical manner on the recording material such that each of the four beams reaches the recording material at the same point and same time; and repeating the process to write the two-dimensional pattern pixel by pixel on the recording material.

According to one exemplary embodiment of the present invention, a method for writing an arbitrary, two-dimensional pattern using interferometric lithography includes the steps of: (1) creating a pixel array defined by a number of pixels having specific coordinates; (2) mapping pixel information based on the desired pattern, the pixel information including a list of which pixels are activated to define the desired two-dimensional pattern; (3) controlling a relative strength of each pixel for indicating a feature height of a portion of the desired two-dimensional pattern; and (4) controlling a degree that one pixel is shifted in an x-direction and a y-direction relative to original coordinates of the pixel in order to define the desired two-dimensional pattern pixel by pixel.

In another aspect of the present invention, a system for writing an arbitrary, two-dimensional pattern using interferometric lithography on a recording material includes a source of a light beam having a prescribed wavelength and a program that creates a pixel array defined by a number of pixels having specific base coordinates and permits the two-dimensional pattern to be mapped on the pixel array. Each pixel has a corresponding A coefficient, α coefficient value and the β coefficient, the A coefficient value representing the relative intensity of the pixel. The α coefficient value represents the degree that the pixel is shifted horizontally (x-direction) relative to base coordinates of the pixel and the β coefficient value represents the degree that the pixel is shifted vertically (y-direction) relative to the base coordinates of the pixel. The shifting of one or more pixels forms one or more non-linear features of the pattern. Based on inputted information regarding the desired two-dimensional pattern to be formed, the program determines the corresponding A coefficient value, α coefficient value and the β coefficient value needed for each pixel to form the two-dimensional pattern pixel by pixel on the recording material. The system further includes a device that communicates with the program and writes the two-dimensional pattern on a recording material using interferometric lithography techniques that manipulate the light beam.

These and other aspects, features and advantages shall be apparent from the accompanying Drawings and description of certain embodiments of the invention.

BRIEF DESCRIPTION OF THE DRAWINGS

FIG. 2 is a graphic representation of one pixel having an M×M subarray of pixels;

DETAILED DESCRIPTION OF CERTAIN EMBODIMENTS OF THE INVENTION

According to one aspect and one embodiment of the present invention, a process is provided for writing an arbitrary, two-dimensional pattern using nonlinear, classical interferometric lithography. This process can easily be implemented and has widespread applicability, especially in the integrated circuit industry, as described in detail below. Classical interferometric lithography techniques treat light classically as a composite electromagnetic wave as opposed to quantum techniques where a small, well-defined number of photons are directed at the recording medium at one time.

Figure 1:
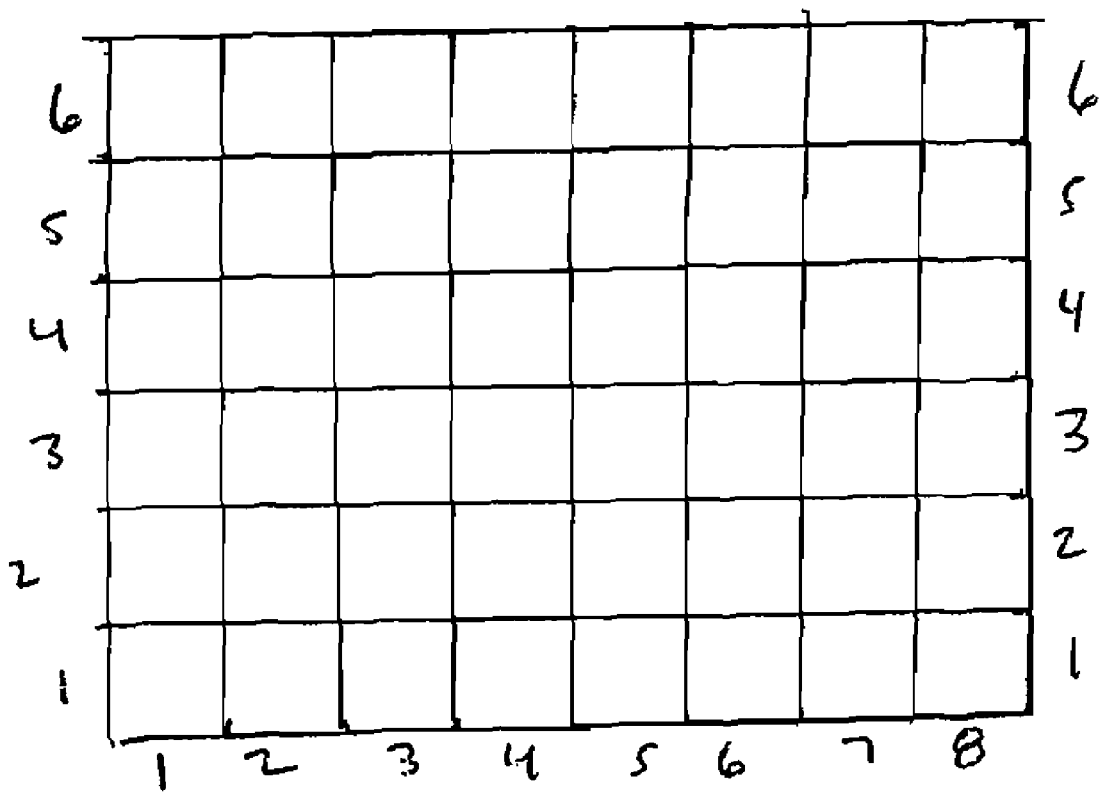
FIG. 1 is graphic representation of an H×V spatial grid (pixel) array on which a two-dimensional pattern is mapped according to the present invention.

The present process creates the arbitrary, two-dimensional pattern using an H×V collection of M×M "pixel" arrays that are arranged to provide a coordinate system that allows the location and characteristics of the two-dimensional pattern to be more easily expressed (M=degree of resolution enhancement). FIG. 1 shows an exemplary H×V pixel array display and in this case, an 8×6 spatial array is illustrated with each pixel being depicted as a square box. It will be understood that the size of the pixel array will vary depending upon the size of the two-dimensional pattern that is to be formed and therefore, the larger the two-dimensional pattern that is to be formed, the larger the pixel array needs to be in order to properly and accurately map the location and coordinates of the pattern.

It will be appreciated that the present process permits and allows control over which pixels are "ON", including turning the pixels only partially on to control relative feature heights. In other words, the process permits the operator to specifically target which pixels are activated compared to a surrounding background and at what intensity in order to define the two-dimensional pattern. Prior, high-resolution, classical interferometric lithographic systems and processes, such as the one previously described, were primarily limited to producing a one-dimensional pattern and therefore suffered from a number of disadvantages including that the pattern fails to have a second dimension component that permits the pattern to have corners, curves, or otherwise depart from a simple linear structure. As is known, in its simplest form: a line describes one dimension, a plane describes two dimensions, and a cube describes three dimensions.

Since, it is desired and most times demanded from the integrated circuit industry that the pattern have a non-linear construction, the process and system of the present invention permit a more complex two-dimensional pattern to be formed. This allows a pattern, such as the one illustrated in FIG. 3 or FIG. 7, to include corners, bends, and branches off of a main segment or line. For purpose of illustration and to more easily identify the individual pixels of the array, the x-axis is numbered 1 through 8, while the y axis is numbered 1 through 6 in the embodiment of FIG. 3. Thus, each individual pixel can be identified by its, x and y coordinate, such as (8,2) or (4,5).

Figure 2:
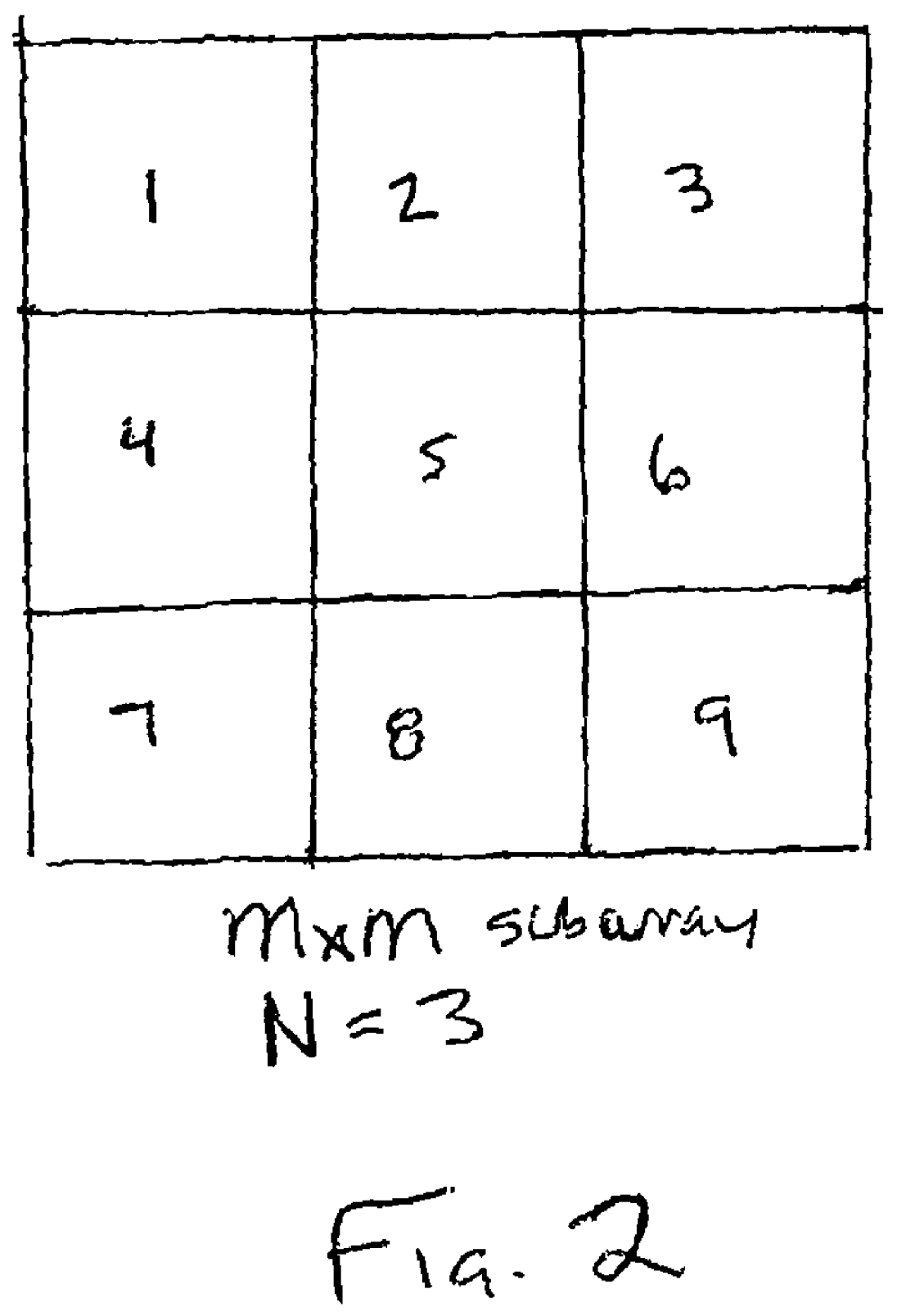
Figure 3:
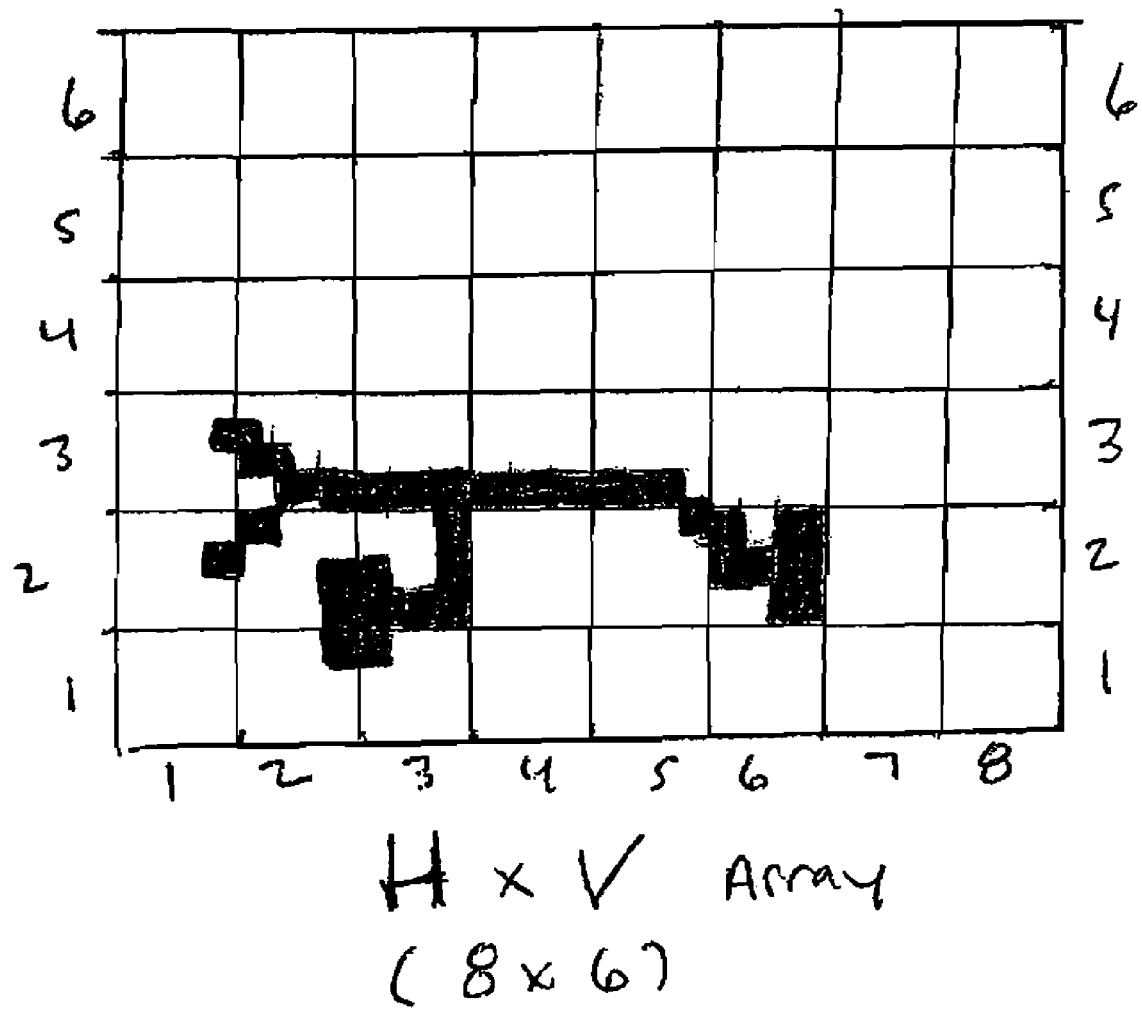
FIG. 3 is a graphic representation of an exemplary two-dimensional pattern that is mapped on the H×V spatial array of FIG. 1.
Figure 4:
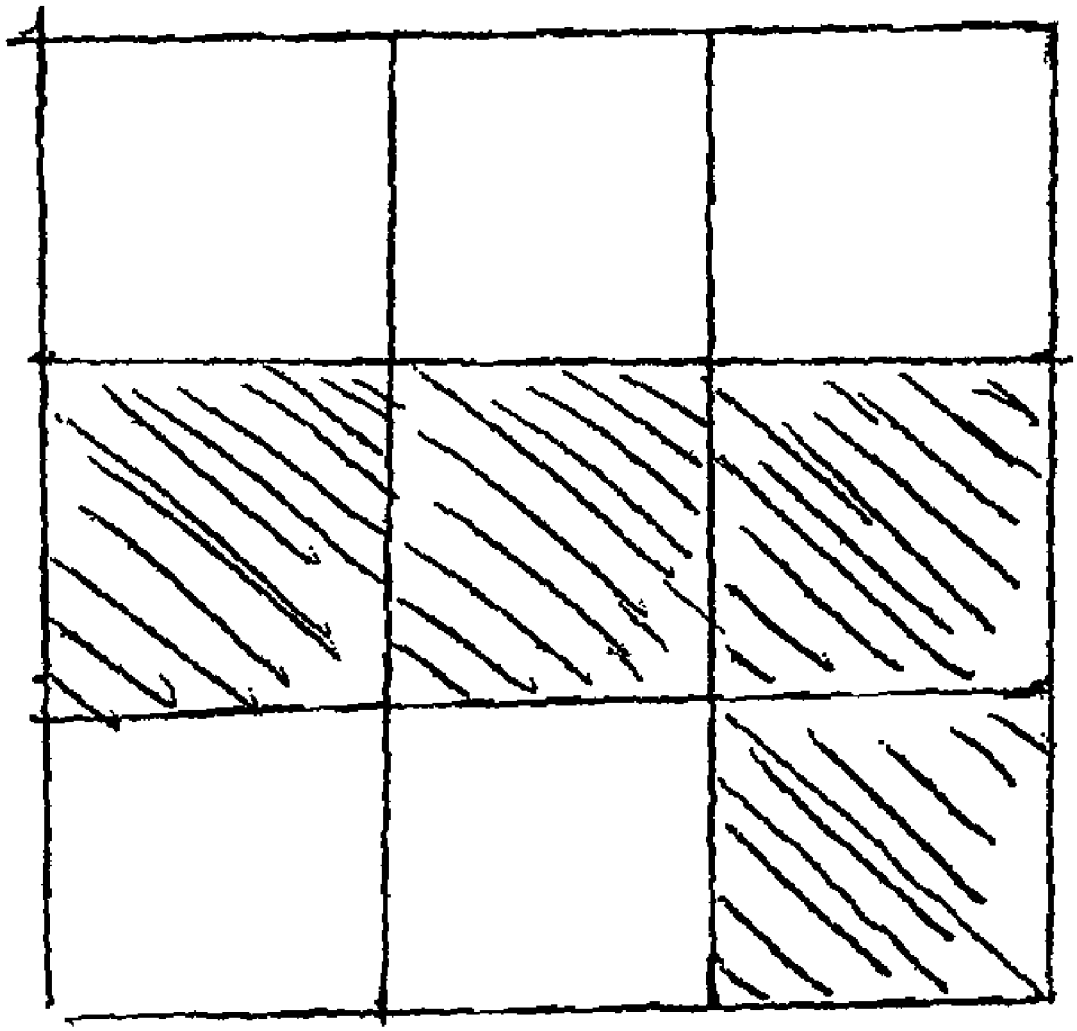
FIG. 4 is a graphic representation of a section of the pattern of FIG. 3 and its placement within select subarray pixels.

In addition and according to one aspect of the present invention, the H×V pixel array can be further broken down and further defined by having each pixel made up of an M×M subarray, where M is the order of resolution enhancement, with M less than or equal to N, where N is the order of absorption (e.g., order of absorption of an N photon absorption recording medium). For example, when N=1, each pixel does not include a subarray of pixel; when N=2, each pixel may include up to a 2×2 subarray of pixels; and when N=3, each pixel may include up to a 3×3 subarray of pixels. FIG. 2 illustrates a single pixel from the H×V pixel array of FIG. 1 and where N=3 such that the single illustrated pixel is defined by a 3×3 subarray of pixels. For purpose of illustration only, the subarray pixels have been numbered 1 through 9 to allow specific coordinates to be more easily identified herein. By having each pixel further broken down into a subarray of pixels, distinct regions and locations within one pixel can be identified by subarray coordinates and this permits the establishment of finer patterns with more precise detail. For example and as shown in FIG. 4, the two-dimensional pattern that is to be formed only is defined by the subarray pixels numbered 4, 5, 6, and 9 in FIG. 2. In other words, within one individual pixel (e.g., pixel (7,3) of the array of FIG. 1), the pattern is written only on portions (defined by the subarray of pixels) of the one pixel as opposed to having to be written on the entire area of the pixel. By creating a pixel subarray for each pixel, resolution enhancement is made possible and more detailed, smaller two-dimensional patterns become possible and in fact, are easily written using the present interferometric writing process. It will be understood that FIG. 4 illustrates a single main pixel from the array of FIG. 1 and therefore, as shown in FIG. 3, the two-dimensional pattern can extend over select areas of a number of different pixels.

In addition, the present process permits the operator to control a number of important parameters in the writing process. In the following discussion, the term "pixel" refers to the smallest unit of the pixel array pattern and therefore, when N=1, a "pixel" is an entire single pixel, such as pixel (6,5) of FIG. 1. However, when N is greater than 2, a "pixel" can refer to a subarray pixel that defines a portion of one pixel. For example, when N=3, a "pixel" can be an area that represents up to ⅑ of the entire main pixel area and when N=2, the pixel can occupy an area that can be up to ¼ of the entire main pixel area.

According to one aspect of one embodiment of the present invention, each pixel can be shifted any amount horizontally and/or vertically from the basic grid location of the pixel. The defining equation (1) for the resulting electric field is:

$$E_{i,j} = A_{i,j}\{e^{i\delta_{i,j}}[e^{ikx} + e^{-ikx}e^{i\phi_{i,j}}] + [e^{iky} + e^{-iky}e^{i\theta_{i,j}}]\} \quad (1)$$

where $\delta_{i,j} = [\theta_{i,j} - \phi_{i,j}]/2$ with $\phi_{i,j} = 2\pi(i + \alpha_{i,j})/M$ and $\theta_{i,j} = 2\pi(j + \beta_{i,j})/M$. The A coefficients determine the relative strength of the pixels, from 0 to 1, while the $\alpha$ and $\beta$ coefficients determine how much the pixel is shifted in the x- and y-directions, respectively, from its standard grid location as described in greater detail below. Thus, for M=3, i=1, 2, or 3 and j=1, 2 or 3 and as described with reference to FIG. 4, the subscripts i and j define individual pixels of the subarray shown in FIG. 4 and more particular, each (i, j) coordinate defines one subarray pixel for a given main pixel.

With respect to the coefficient A, when A=1, the pixel is completely activated and is shown with greater intensity in the display of the written pattern, whereas, when A=0, the pixel is not activated and the two-dimensional pattern is not defined by this pixel since the individual architectural features of the pattern do not extend into this non-activated pattern. However, the operator can set A to be between 0 and 1 in order to define pixel areas that are not completely activated. The coefficient A can therefore be thought of as being representative of an intensity of light for each pixel.

The coefficient A provides a means for the operator to easily display different feature heights in the pattern by showing different levels of pixel intensity in the pattern. For example, areas where A=1 and the pixels are completely activated can indicate areas that at a future time will be etched at a greater depth than other areas when forming the integrated circuit product. The areas where A is between 0 and 1 can represent areas that later will not be etched as deeply as the areas where A=1. When the pattern is displayed as on a computer screen or the like, the different intensities of the pattern represented by differing values of A can be indicated by using different colors or different intensities of a color to permit the operator to easily differentiate the different areas on the screen. For example, the areas where A=1 can be depicted in a deep color, such as purple or blue, or by a bright color, such as red; while, the areas where A is between 0 and 1 can be depicted in a light color, such as yellow or orange. In this manner, the present process provides a detailed map and guide for future processing operations that use the two-dimensional pattern.

In accordance with another aspect of the present invention, the present process also provides the operator with a means for shifting a particular pixel that forms and defines a portion of the two-dimensional pattern. More particular, by shifting the pixel in the x-direction and/or the y-direction relative to its original, standard pixel location (grid location), architectural features can be imparted into the design pattern so as to give the desired two-dimension property. In particular, the $\alpha$ coefficient determines how much the pixel is shifted in the x-direction from the standard grid location, while the $\beta$ coefficient determines how much the pixel is shifted in the y-direction from the standard grid location. In other words, the $\alpha$ coefficient controls the degree that a target pixel is moved in the left to right direction on the grid array (e.g., FIG. 2), and the $\beta$ coefficient controls the degree that the target pixel is move in the up and down direction on the grid array (e.g., FIG. 2).

By shifting one or more pixels (subarray pixels) around, non-linear architectural features, such as curves and diagonal sections, can be incorporated into the two-dimensional pattern as illustrated in FIG. 3. For example, in order to incorporate a bend or curve or the like into the pattern, the operator determines which $\alpha$ coefficient and which $\beta$ coefficient will yield the desired pixel shift to define the bend or curve or a diagonal section or the like in the pattern. In other words, by shifting one or more pixels, a departure from a linear portion of the pattern can be created and the degree of the departure from a linear aspect is determined by the $\alpha$ coefficient and the $\beta$ coefficient values. For example, if it is desired to shift the pixel up and to the left, the $\alpha$ and $\beta$ coefficients are inputted by the operator or are determined by a program based on equation (1) to cause the desired change.

The total deposition on an N-photon absorber (recording material) is given by a two-dimensional sum over the grid and is defined by equation (2):

$$I(x, y) = \sum_{j=1}^{M} \sum_{i=1}^{M} [E_{i,j}^* E_{i,j}]^N. \tag{2}$$

Note that this method is not merely a combination of two one-dimensional patterns. It is truly a coherent interference of the two dimensions as opposed to conventional prior interferometric systems. Simply adding intensities in two dimensions by the technique described in the Optics Express article referenced in the background section herein would lead to low visibilities and reduced resolutions and would offer clearly unsatisfactory and inferior results compared to the process of the present invention. The coherent interference, however, produces localized points, or the "pixels" of the pattern to be created. Thus by specifying the A, $\alpha$ and $\beta$ coefficients, one can create an arbitrary, high-resolution pattern pixel by pixel. This process offers a marked improvement over conventional interferometric systems that at best offer only a system and process for producing a one dimensional pattern. In today's complex integrated circuit industry, a one dimensional pattern is simply not acceptable for most applications.

It will be appreciated that when M=1, there will be a single A coefficient value, a single $\alpha$ coefficient value and a single $\beta$ coefficient value for each large pixel (main pixel). When M=2, there are four A coefficient values, four $\alpha$ coefficient values and four $\beta$ coefficient values for each large pixel. When M=3, there are nine A coefficient values, nine $\alpha$ coefficient values and nine $\beta$ coefficient values for each large pixel. By controlling the values of the $\alpha$ coefficient value and the $\beta$ coefficient value, the pixel can be shifted in a fractional amount relative to the standard grid location in order to create the desired architectural features.

In addition, the present process and system of the present invention can include a program that optimizes the A coefficient, $\alpha$ coefficient, and $\beta$ coefficient values. Accordingly, once the user inputs the desired parameters and characteristics of the two-dimensional pattern that is to be formed, the program will calculate which pixels and subarray pixels need to be activated in order to form the pattern and further, the program calculates the degree of shift, if any, that is needed to establish and write the two-dimensional pattern.

It will be appreciated that in equation (1), the delta plus phi and theta values provide a $2\pi/M$ phase shift which corresponds to a shift from one subarray pixel to an adjacent subarray pixel. Thus, if the $\alpha$ and $\beta$ coefficient values were equal to 0, the phase shift would be a $2\pi/M$ shift resulting in a phase shift from one subarray pixel to an adjacent subarray pixel. The $\alpha$ and $\beta$ coefficient values provide information as to how much phase shift occurs from the $2\pi/M$ shift to the adjacent subarray pixel. It will also be understood that the delta value in the above equation looks at the difference in the x information and the y information and in particular, at the relative phase difference between the x and y beams so as to create the desired interference pattern as opposed to a mere adding of the x and y information.

The portion of the method described above is for generating one H×V array. However, any number of these arrays can be generated in parallel by impressing the amplitude and phase factors to appropriate portions of the beam (that is, use spatial modulation across the beam, with each region of modulation becoming one area in which an H×V array will be created). In total, one generates an array of arrays. While there are many ways one could impress the amplitude and phase structure on the beam, if it is desired to implement this in a fast, repeatable method with a large number of arrays generated in parallel across the beam, spatial light modulators (SLMs) are a preferred choice for at least some applications. However, other devices and techniques besides SLMs, such as using a mask, can be used once again depending upon the specific application.

The above process and in particular, the interference of the four beams, is repeated $M^2$ times with the relative phases of the beams being altered each time until the desired two-dimensional pattern is formed.

Figure 5:
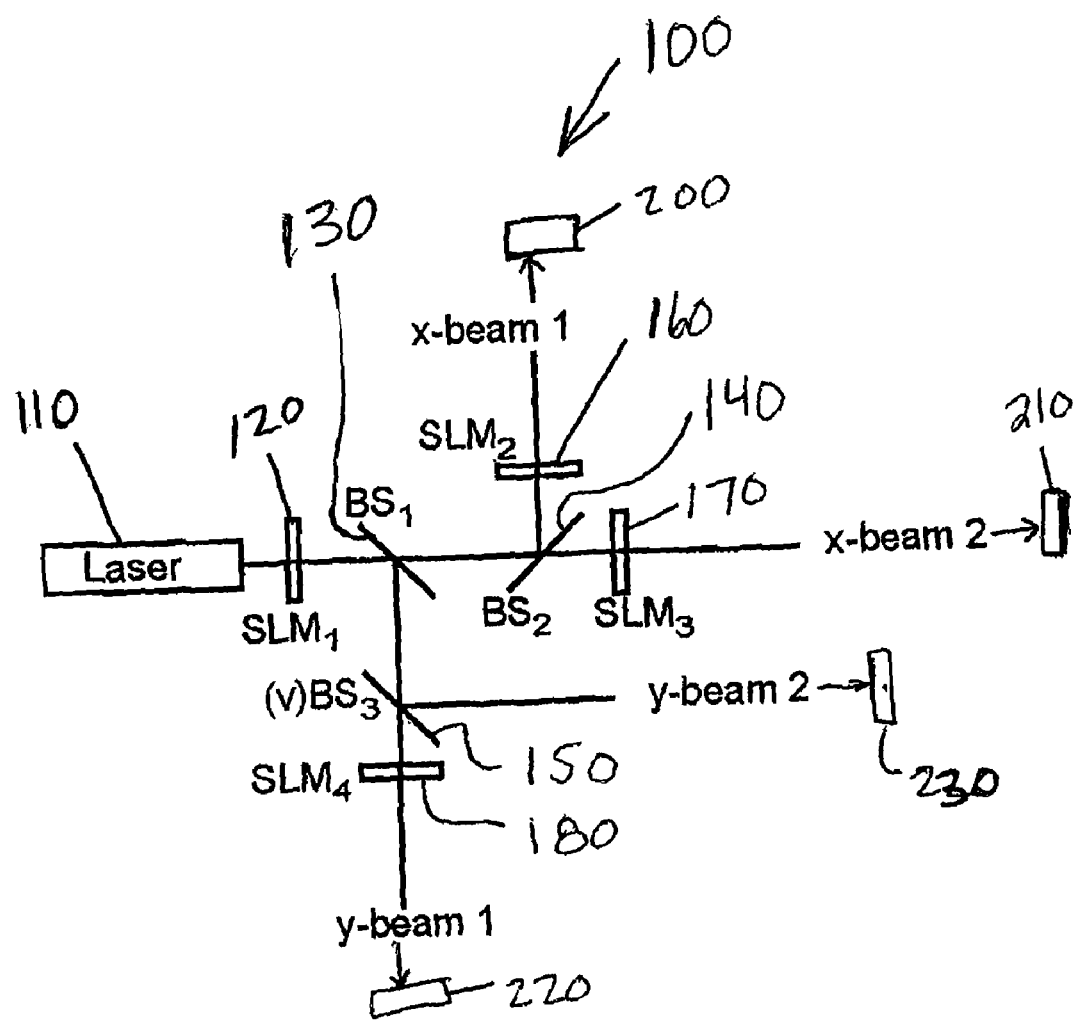
FIG. 5 is a schematic of an interferometric lithographic system according to one exemplary embodiment of the present invention for writing an arbitrary, two-dimensional pattern.

FIG. 5 illustrates a lithographic system 100 for implementing the present method for writing an arbitrary, two-dimensional pattern using nonlinear, classical interferometric lithography. The system 100 includes a device 110 for generating light and in particular, the device 110 generates and emits a beam of light having given characteristics. For example, the device 110 can be in the form of a laser, such as an argon or krypton laser, that generates an output having a wavelength of less than 200 nm. Once again, it will be appreciated that the type of laser and the associated wavelength of its output depends upon the specific application and in particular, on the specific details of the two-dimensional pattern that is to be formed and on other parameters, such as the order of absorption (N) for the recording medium. In general, lasers that have outputs with shorter wavelengths are particularly preferred in order to form the complex, fine details, such as sharp corners, of the two-dimensional pattern.

According to one exemplary arrangement, the output beam from the laser 110 is directed to a first spatial light modulator 120. A spatial light modulator (SLM) 120 is an object that imposes some form of spatially-varying modulation on a beam of light. Typically, an SLM is used to modulate the intensity of the light beam; however, it is also possible to produce SLM devices that modulate the phase of the beam or even both the intensity and the phase simultaneously. The use of an SLM is one manner in which the amplitude and phase structure on the beam can be impressed and the use of an SLM permits implementation of the present invention in a fast, repeatable process with a large number of arrays generated in parallel across the beam. In particular, the amplitude structures for the first pixels are imposed on each of the spatial regions by the first SLM 120. It will therefore be appreciated that the first SLM 120 is designed to control the amplitude and consequently is represented by the A coefficient in the above equation. Thus, the first SLM 120 plays a role in controlling which pixels are activated and the degree that the pixels are activated (e.g., the intensity of the light that forms the pattern).

The beam is then split into two beams by means of a first beam splitter 130, with one beam (first beam) carrying the horizontal (x) information and another beam (second beam) carrying the vertical (y) information. Each of the first and second beams is again split into two beams. More specifically, the first beam (x-beam) is split into two beams (x-beam 1 and x-beam 2) by means of a second beam splitter 140 that acts on the first beam (x-beam). Similarly, the second beam (y-beam) is split into two beams (y-beam 1 and y-beam 2) by means of a third beam splitter 150. It will be appreciated that the third beam splitter 150 is a vertically aligned beam splitter that splits the y-beam vertically rather than horizontally as is the case with the second beam splitter 140.

For each of the two x-beams and one of the y-beams (y-beam 1), the appropriate phase factors are imposed on the spatial regions by using additional SLMs. In particular, a second SLM 160 is placed along the optical path (beam path) of the x-beam 1 to act thereon and imposed prescribed phase factors and a third SLM 170 is placed along the optical path (beam path) of the x-beam 2 to act thereon and imposed prescribed phase factors. A fourth SLM 180 is placed along the optical path (beam path) of the y-beam 1 to act thereon and imposed prescribed phase factors.

It will therefore be understood that the second, third and fourth SLMs 160, 170, 180 control the relative phases of the 3 beams (e.g., x-beam 1, x-beam 2, and y-beam 1 in the illustrated embodiment). Accordingly, the second SLM 160, the third SLM 170 and the fourth SLM 180 have associated α and β coefficient values, the combination of which result and lead to the values of delta, delta plus phi and theta as defined above after equation 1. As is apparent from the above equation 1, one of the four beams (in this case, the y-beam 2) does not have a phase shift and as a result, only three of the four beams have been shifted based on the imposed phase factors.

The system 100 is also constructed so that all four beams converge onto the same point by means of the optical components described below. In particular, the two y-beams (1 and 2) converge from the top and bottom onto the one point and the two x-beams (1 and 2) converge from the left and right onto the one point. The optical components of the system 100 are arranged so that all four beams converge on the same point and at the same time. For example, x-beam 1 can have a first optic component 200 associated therewith; the x-beam 2 can have a second optic component 210 associated therewith; the y-beam 1 can have a third optic component 220 associated therewith; and the y-beam 2 can have a fourth optic component 230 associated therewith. The optic components 200, 210, 220, 230 are constructed and arranged to focus the four beams on the single point for the writing of the two-dimensional pattern. In one exemplary embodiment, the first optic component 200 is a first lens/mirror combination; the second optic component 210 is a second lens/mirror combination; the third optic component 220 is a third lens/mirror combination; and the fourth optic component 230 is a fourth lens/mirror combination. Thus, each beam has its own associated lens/mirror arrangement for directing the respective beam in a prescribed manner. More specifically, the first and second optic components 200, 210 serve to bring the x-beams (x-beams 1 and 2) in to interfere in a horizontal manner and the third and fourth optic components 220, 230 serve to bring the y-beams (y beams 1 and 2) in to interfere in a vertical manner.

Alternatively, instead of having a lens/mirror combination for each beam, a focusing mirror can be used instead and arranged within the path of one of the beams. In other words, four focusing mirrors can be used to cause the four beams to converge on the same point.

Figure 6:
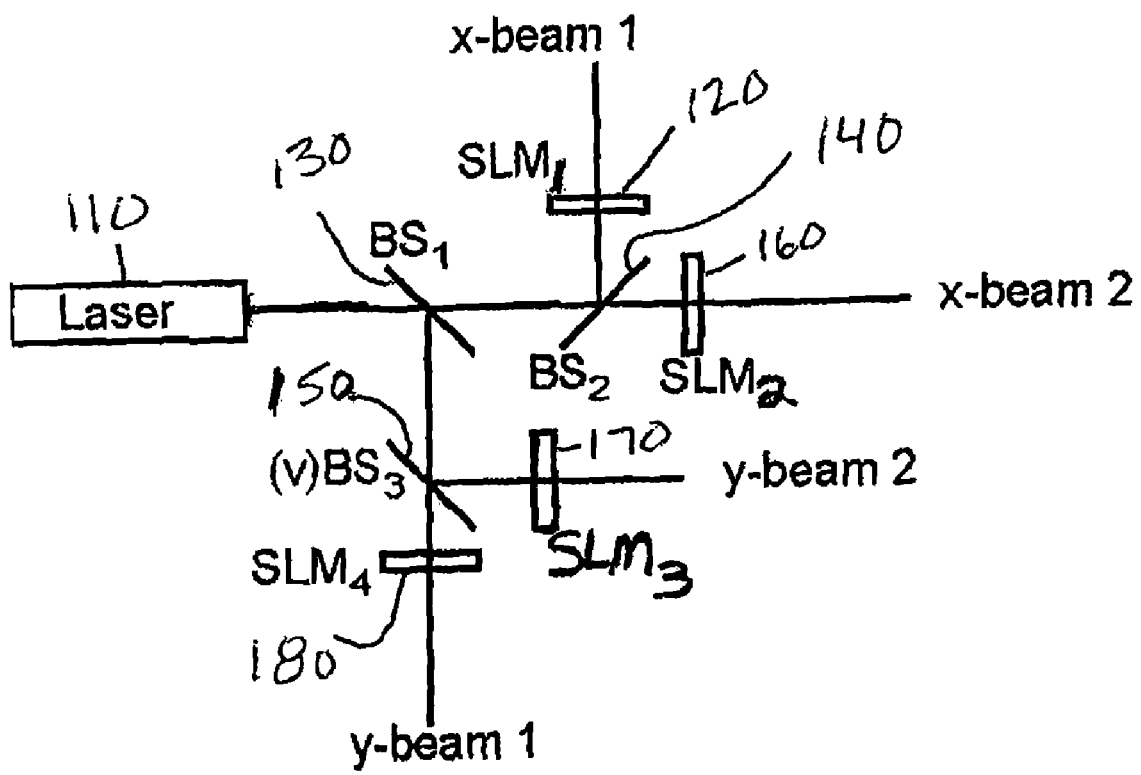
FIG. 6 is a schematic of an interferometric lithographic system according to one exemplary embodiment of the present invention for writing an arbitrary, two-dimensional pattern.

FIG. 6 shows an alternative embodiment to the system 100 of FIG. 5. In this embodiment, the first SLM 120 that was previously positioned before the first beam splitter 130 is now positioned in the path of the x-beam 1 after the beam is split by the second beam splitter 140. Similarly, the second SLM 160 is positioned in the path of the x-beam 2 downstream of the second beam splitter 140. The third SLM 170 is positioned in the path of the y-beam 2 after the beam is split by the beam splitter 150 and the fourth SLM 180 is positioned in the path of the y-beam 1 downstream of the third beam splitter 150. It will be appreciated that in this embodiment, each of the beam paths has an associated SLM that is configured to impose the appropriate phase factors (combinations of the A coefficient, α coefficient, and β coefficient values) on the respective beam since the first SLM 120 that originally was designed to impose the amplitude structures for the pixels has been moved from the position before the first beam splitter 130.

In yet another embodiment, a mask can be used instead of the SLMs; however, the general principles of the present invention still apply to this embodiment, in that by specifying the A coefficient, α coefficient, and β coefficient, an arbitrary, high resolution pattern is created pixel by pixel. In other words, the actual equipment used to implement the present process is not critical so long as a two-dimensional, high-resolution pattern is formed.

Example

Figure 7:
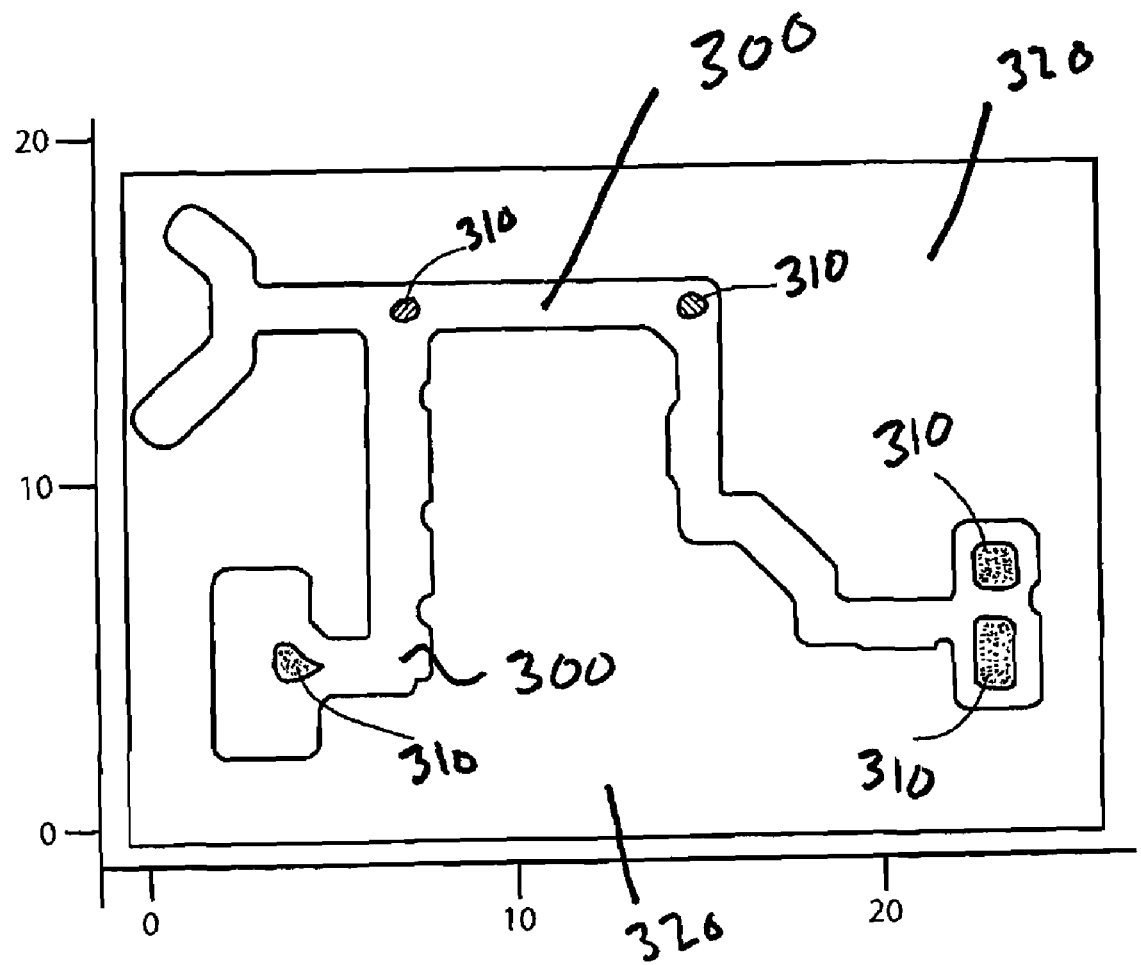
FIG. 7 is a schematic of a simulated pattern formed using the system and writing technique of the present invention.

FIG. 7 shows a simulated pattern 300 that is formed from the above-described process. Cross-hatching 310 within the pattern 300 represents the heights of the features, with an area 320 around the pattern 300 being a zero background and the cross-hatching 310 representing areas that in the future will have a greater etch depth. For this example, a three-photon absorber is assumed (N=3), resulting in three-times resolution enhancement, equivalent to feature sizes as small as 26 nm using a 157 nm source (laser 110). An 8×6 spatial array of the 3×3 sub-arrays is used, generating an overall pattern of 24×18 pixels total for the image shown.

The present invention provides a technique that allows for generation of arbitrary, high-resolution two-dimensional lithographic patterns in an inexpensive and simple-to-implement method. It is important to note that the technique, while requiring precise alignment as does any critical imaging technique, does not require any non-standard equipment. In fact, the entire system is relatively inexpensive. Also, no complicated algorithm is needed to determine the needed phase and amplitude coefficients for any given pattern. It is simply a mapping of pixel information from a desired pattern. While one limiting factor of the technique is the availability of appropriate multi-photon absorbing materials, these materials are continually being engineered and advanced. The present process is particularly suited and can offer substantial improvements and advancements in the integrated circuit industry.

While the invention has been described in connection with certain embodiments thereof, the invention is capable of being practiced in other forms and using other materials and structures. Accordingly, the invention is defined by the recitations in the claims appended hereto and equivalents thereof.

What is claimed is:

1. A method for writing an arbitrary, two-dimensional pattern using interferometric lithography comprising the steps of:
creating a pixel array defined by a number of pixels having specific coordinates;
mapping pixel information based on the desired pattern, the pixel information including a list of which pixels are activated to define the desired two-dimensional pattern;
controlling a relative strength of each pixel for indicating a feature height of a portion of the desired two-dimensional pattern;
controlling a degree that one pixel is shifted in an x-direction and a y-direction relative to original coordinates of the pixel in order to define the desired two-dimensional pattern pixel by pixel; and
writing the two-dimensional pattern pixel by pixel on a recording material; wherein each pixel has an associated A coefficient value, an α coefficient value and a β coefficient value, the A coefficient value representing the relative intensity of the pixel, the α coefficient value representing the degree that the pixel is shifted horizontally (x-direction) relative to base coordinates of the pixel, the β coefficient value representing the degree that the pixel is shifted vertically (y-direction) relative to the base coordinates of the pixel, wherein the shifting of one or more pixels forms non-linear features of the pattern.

2. The method of claim 1, wherein a resulting electric field for a given pixel is determined by the equation:

$$E_{i,j} = A_{i,j}\{e^{i\delta_{i,j}}[e^{ikx} + e^{-ikx}e^{i\phi_{i,j}}] + [e^{iky} + e^{-iky}e^{i\theta_{i,j}}]\}$$

where $\delta_{i,j} = [\theta_{i,j} - \phi_{i,j}]/2$ with $\phi_{i,j} = 2\pi(i+\alpha_{i,j})/M$ and $\theta_{i,j} = 2\pi(j+\beta_{i,j})/M$; and wherein the value of the A coefficient is from 0 to 1.

3. The method of claim 2, wherein the total deposition on the recording material is given by a two-dimensional sum over the pixel array and is defined as:

$$I(x, y) = \sum_{j=1}^{M} \sum_{i=1}^{M} [E_{i,j}^* E_{i,j}]^N.$$

4. A method for writing an arbitrary, two-dimensional pattern using interferometric lithography comprising the steps of:
creating a pixel array defined by a number of pixels having specific coordinates;
mapping pixel information based on the desired pattern, the pixel information including a list of which pixels are activated to define the desired two-dimensional pattern;
controlling a relative strength of each pixel for indicating a feature height of a portion of the desired two-dimensional pattern;
controlling a degree that one pixel is shifted in an x-direction and a y-direction relative to original coordinates of the pixel in order to define the desired two-dimensional pattern pixel by pixel; and
writing the two-dimensional pattern pixel by pixel on a recording material outputting a first beam of light;
splitting the first beam into the second and third beams by a first beam splitter,
disposing a second beam splitter in the path of the second beam to split it into an x-beam 1 and an x-beam 2;
disposing a third beam splitter in the path of the third beam to split it into a y-beam 1 and a y-beam 2;
disposing a first spatial light modulator (SLM) in the path of the x-beam 1;
disposing a second SLM in the path of the x-beam 2;
disposing a third SLM in the path of the y-beam 2 and disposing a fourth SLM in the path of the y-beam 1; and
arranging a plurality of optical components and positioning them relative to the x-beam 1, the x-beam 2, the y-beam 1 and the y-beam 2 so that the y-beam 1 and the y-beam 2 interfere in a vertical manner and the x-beam 1 and the x-beam 2 interfere in a horizontal manner and each of the four beams reaches the recording material at the same point and same time;
wherein each pixel has an associated A coefficient value, an α coefficient value and a β coefficient, the A coefficient value representing the relative intensity of the pixel, the α coefficient value representing the degree that the pixel is shifted horizontally (x-direction) relative to base coordinates of the pixel, the β coefficient value representing the degree that the pixel is shifted vertically (y-direction) relative to the base coordinates of the pixel, wherein the shifting of one or more pixels forms non-linear features of the pattern; and wherein the SLMs have associated phase factors for controlling the amplitude and phase shifts of the respective beams to cause the four beams to reach the recording material at the same point and same time.

5. A system for writing an arbitrary, two-dimensional pattern using interferometric lithography on a recording material comprising:

a source of a light beam having a prescribed wavelength;

a computer having non-transitory tangible media that is configured to create a pixel array defined by a number of pixels having specific base coordinates and permits the two-dimensional pattern to be mapped on the pixel array, wherein each pixel has a corresponding A coefficient, an α coefficient value and β coefficient value, the A coefficient value representing the relative intensity of the pixel, the α coefficient value representing the degree that the pixel is shifted horizontally (x-direction) relative to base coordinates of the pixel, the β coefficient value representing the degree that the pixel is shifted vertically (y-direction) relative to the base coordinates of the pixel, wherein the shifting of one or more pixels forms one or more non-linear features of the pattern, wherein based on inputted information regarding the desired two-dimensional pattern, the computer determines the corresponding A coefficient value, the α coefficient value and the β coefficient value needed for each pixel to form the two-dimensional pattern pixel by pixel; and a device that communicates with the computer and writes the two-dimensional pattern on the recording material using classical interferometric lithography techniques that act on the light beam.

6. A method for writing an arbitrary, two-dimensional pattern on a recording material using interferometric lithography and classical techniques comprising the steps of:

creating a pixel array defined by a number of main pixels having specific coordinates;

dividing each main pixel into an M×M subarray of pixels to permit a specific region within one main pixel to be identified by subarray coordinates to permit finer patterns to be established with precise detail on the recording material, where $M \leq N$, where M is a level of resolution enhancement and N is the order of absorption of an N photon absorber which comprises the recording material;

generating and treating a light beam classically as a composite electromagnetic wave, the light beam being divided into first and second light beams that carry horizontal (x) information and third and fourth light beams that carry vertical (y) information; and interfering the first and second beams in a horizontal manner on the recording material and interfering the third and fourth beams in a vertical manner on the recording material such that each of the four beams reaches the recording material at the same point same time to write the two-dimensional pattern pixel by pixel;

wherein each subarray pixel has an associated A coefficient value, an α coefficient value and a β coefficient value, the A coefficient value representing the relative intensity of the pixel, the α coefficient value representing the degree that the pixel is shifted horizontally (x-direction) relative to base coordinates of the pixel, the β coefficient value representing the degree that the pixel is shifted vertically (y-direction) relative to the base coordinates of the pixel, wherein the shifting of one or more pixels forms non-linear features of the pattern.

* * * * *